United States Patent [19]
Price

[11] 4,147,971
[45] Apr. 3, 1979

[54] IMPEDANCE TRIM NETWORK FOR USE IN INTEGRATED CIRCUIT APPLICATIONS

[75] Inventor: John J. Price, Mesa, Ariz.

[73] Assignee: Motorola, Inc., Schaumburg, Ill.

[21] Appl. No.: 826,577

[22] Filed: Aug. 22, 1977

[51] Int. Cl.$^2$ .............................................. G05F 3/08
[52] U.S. Cl. ...................................... 323/4; 323/74; 323/80; 323/94 R; 323/97; 330/261
[58] Field of Search .................... 323/74, 79, 80, 81, 323/94 R, 96, 97, 4, 9; 330/252, 261; 338/48, 92, 128, 200, 289, 295; 340/347 CC

[56] References Cited

U.S. PATENT DOCUMENTS

| | | | |
|---|---|---|---|
| 2,999,202 | 9/1961 | Ule | 323/74 |
| 3,541,430 | 11/1970 | Luger | 323/79 |
| 3,890,610 | 6/1975 | Cahen | 340/347 CC |
| 4,016,483 | 4/1977 | Rudin | 323/74 |

OTHER PUBLICATIONS

Electronic Design 4, Feb. 15, 1977, "First Monolithic 12-Bit DAC Uses a New Zener Trim Technique" by D. Barnes, ISSCC Dig. of Tech. Papers, Feb. 1975, p. 193.

*Primary Examiner*—Gerald Goldberg
*Attorney, Agent, or Firm*—Michael D. Bingham

[57] ABSTRACT

An adjustable impedance network is disclosed which is suitable to be used in monolithic circuit applications to eliminate problems caused by processing tolerances. One example of such use is to employ the impedance network in the collector circuit of a differential amplifier to eliminate input voltage offset errors. The impedance network includes a plurality of impedance elements serially coupled together between first and second terminals which in the above example would be coupled to respective collector output electrodes of the differential amplifier. Each impedance element is initially electrically shorted by a respective one of a plurality of thermally machinable metallic link. In addition, a selected number of the impedance elements are electrically shorted to a common terminal by two additional metal links which are serially connected together across said selected number of impedance elements. The impedance elements are binary weighted to provide a maximum number of trim values. A laser apparatus may be used to cut or machine appropriate links to open circuit the link to add predetermined resistance between either the first or second terminal of the network and the common terminal thereof. Thus, in the above example, resistance may be added to either collector load resistor of the differential amplifier to compensate for mismatch in the transistors comprising the amplifier.

9 Claims, 2 Drawing Figures

IMPEDANCE TRIM NETWORK FOR USE IN INTEGRATED CIRCUIT APPLICATIONS

CROSS REFERENCE TO A RELATED APPLICATION

The subject matter of the subject application is related to the subject matter of an application entitled "A TRIM NETWORK FOR MONOLITHIC CIRCUITS AND METHOD OF TRIMMING", Ser. No. 719,549 by John J. Price, assigned to Motorola, Inc.

BACKGROUND OF THE INVENTION

1. Field of Art

This invention relates generally to adjustable impedance networks and more particularly, to an impedance trim circuit suitable for use in monolithic circuit applications for adjusting operating characteristic error signals of the circuit.

2. Description of the Prior Art

The need for a monolithic adjustable trim circuit for use in several integrated circuit applications has long been felt. Many integrated circuit structures have errors associated therewith caused by processing tolerance problems. For instance, most all monolithic differential amplifiers have input voltage offset errors caused primarily by mismatch in the differential transistors which comprise the amplifier. In the past, to eliminate these offset errors, discrete trimming potentiometers have been employed. Several disadvantages are associated with such discrete potentiometers. First, the physical size of such potentiometers may limit their use in some application. For each differential amplifier that is used in a system a respective potentiometer would be required that must be manually adjusted to trim the amplifier. As each monolithic differential amplifier employed in a system may require a trimming potentiometer the cost of such systems linearly increases accordingly. Thus, there is a need for an integrated adjustable impedance network which may be utilized in monolithic differential amplifier circuits to eliminate the voltage offset errors associated therewith. Additionally, there is a need for a relatively simple adjustable impedance network structure which may be employed in several integrated circuit applications.

At least two prior art teachings have recognized the above needs. For instance, in the application by John J. Price, supra, there is disclosed a trim circuit and method of trimming the same for eliminating voltage errors otherwise associated with a monolithic digital to analog circuit. U.S. Pat. No. 4,016,483, Rudin, teaches a trim scheme including impedance elements which requires the use of electrical energy for trimming the impedance value of the disclosed impedance network.

From above it is quite apparent that there is a further need for a simple and inexpensive adjustable integrated impedance network that is suitable for use in several different integrated circuit applications.

SUMMARY OF THE INVENTION

Accordingly, it is an object of the present invention to provide an adjustable impedance network suitable to be utilized in several integrated circuit applications.

It is another object of the invention to provide an adjustable impedance network for use in a monolithic differential amplifier circuit to eliminate input voltage offset errors.

A further object of the invention is to provide a trimable impedance network suitable to be utilized in a variety of integrated circuit applications which is capable of being automatically trimmed during the fabrication processes for such integrated circuits.

Still another object of the invention is to provide a monolithic current reciprocator circuit including an adjustable impedance network.

In accordance with the foregoing and other objects there is provided an adjustable impedance network suitable for use in integrated circuit applications. The impedance network comprises: a plurality of impedance elements serially connected between first and second terminals, a plurality of alterable metal links each electrically shorting a respective one of the plurality of impedance elements, an additional pair of serially connected links electrically shorting a selected number of the impedance elements to a common terminal of the network, the impedance value between the common terminal and either one of the first or second terminals being adjusted by selectively open circuiting predetermined ones of the plurality of metal links and the appropriate one of the pair of additional links.

In one feature of the invention the aforedescribed impedance network is utilized between the collector outputs of a differential amplifier and a source of operating potential for eliminating input voltage offset errors.

In another feature of the invention the aforedescribed impedance network is utilized in a current reciprocator circuit for causing the magnitude of the output current to remain constant although changing in polarity depending upon the polarity of an applied input signal.

DETAILED DESCRIPTION OF THE EMBODIMENT

Figure 1:
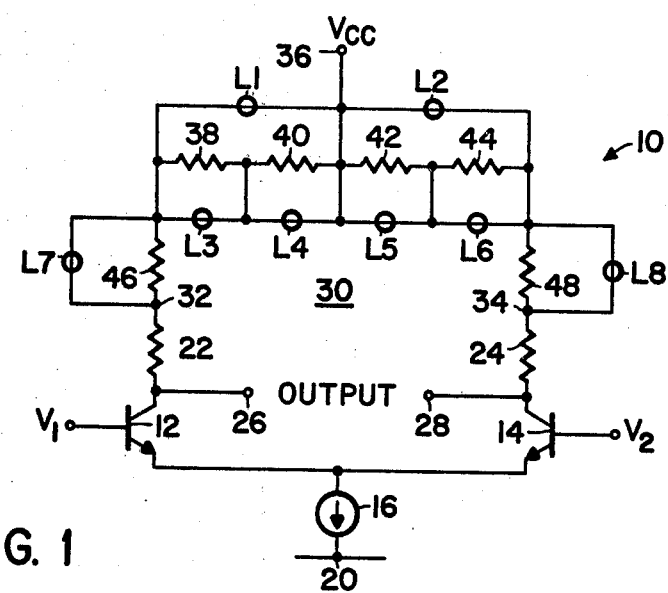
FIG. 1 illustrates in schematic form a differential amplifier circuit including the laser trim network of the present invention.

Referring to FIG. 1 there is shown differential amplifier 10 which is suitable to be manufactured in monolithic integrated circuit form. As is understood, differential amplifier 10 may be utilized as an input stage of an operational amplifier or a comparator circuit. Generally, differential amplifier 10 includes transistors 12 and 14 differentially connected with respective emitter electrodes commonly connected to current source 16. Current source 16 which is returned to a reference potential at terminal 20 produces a current that is evenly divided through the transistors with amplifier 10 being in a balanced operating state. Normally, load resistors 22 and 24 would couple respective collector electrodes of transistors 12 and 14 to a source of operating potential $V_{CC}$. Hence, as is known, in response to a differential input voltage $\pm(V_1-V_2)$ being applied across the base electrodes of transistors 12 and 14 a differential output voltage is derived at the collectors of transistors 12 and 14, between output terminals 26 and 28.

Ideally collector load resistors 22 and 24 as well as transistors 12 and 14 are perfectly matched such that the balanced condition may be maintained at the quiescence. Thus, input offset error signals are cancelled. However because of processing tolerances in the fabrication of the resistors and especially due to the mismatch of transistors 12 and 14 an input offset voltage is generated. Input offset voltage is defined as the input voltage required to provide a zero output voltage between terminals 26 and 28. The input offset voltage can be eliminated by adjusting the value of load resistors 22 or 24 depending upon the polarity of the error.

Trim network 30 of the invention may be utilized in differential amplifier 10 to trim the value of the appropriate load resistor, either resistor 22 or 24. Trim network 30 is shown as being connected between internal nodes 32 and 34 of differential amplifier 10 and power supply terminal 36. Trim network 30 comprises a plurality of binary weighted serially connected resistors 38, 40, 42 and 44 which are electrically shorted by thermally machinable metallic links $L_1$ and $L_2$. Links $L_1$ and $L_2$ are commonly connected to power supply terminal 36. In addition each of the foregoing resistors are electrically shorted by parallel links $L_3$-$L_6$ respectively. Fine trim resistors 46 and 48 are provided which are connected respectively between resistors 38 and 44 to nodes 32 and 34. Shorting links $L_7$ and $L_8$ are connected in parallel across resistors 46 and 48, respectively. In the preferred embodiment resistors 38-44 are binarily scaled having values R, 2R, 4R, 8R respectively. Resistors 46 and 48 typically have a value R. Resistors 38-48 may be of any suitable form, e.g., thin film resistors known in the art and are formed in a known manner on the insulating substrate comprising monolithic amplifier 10.

With trim resistors 38-48 being electrically shorted by respective links $L_1$-$L_8$, differential amplifier 10, comprising an active circuit portion that includes transistors 12 and 14, is in a balanced configuration. Using the same technique of measuring and test as disclosed in Assignee's pending patent application, referenced above, and illustrated in the article entitled "A passive Laser Technique to Improve the Linearity of a Ten Bit D/A Converter", published by the inventor in the *IEEE Journal of Solid State Circuits*, Vol. SC-11, No. 6, (Dec., 1976), a computer can be programmed with a look-up table to determine which of the links $L_3$-$L_6$ should be cut to reduce the offset voltage error by increasing the resistance of either resistor 22 or 24. After determination of which links are to be cut, the computer can instruct a laser apparatus described in the above application and article, or any other high energy source, to open circuit the links by thermal machining. It should be understood that test and trim is done at wafer level in the preferred embodiment. In sequence, link $L_1$ would first be cut to add resistance to resistor 22 or link $L_2$ to add resistance to resistor 24. Next links $L_3$-$L_6$ would be cut as determined. After this initial trim step the offset error may again be measured and checked for required tolerance. If the offset error is still not in tolerance an additional incremental trim can be made in either polarity by cutting links $L_7$ or $L_8$ accordingly.

The advantage of trim network 30 is that an "on-chip" network is provided for trimming of offset voltage errors. The testing and trimming can be accomplished automatically and quickly. The unique and novel trim network of the invention requires very few components to reduce or eliminate offset errors which are common to monolithic differential amplifiers. Using trim network 30 input offset voltages can typically be trimmed to less than 0.3 millivolts.

Figure 2:
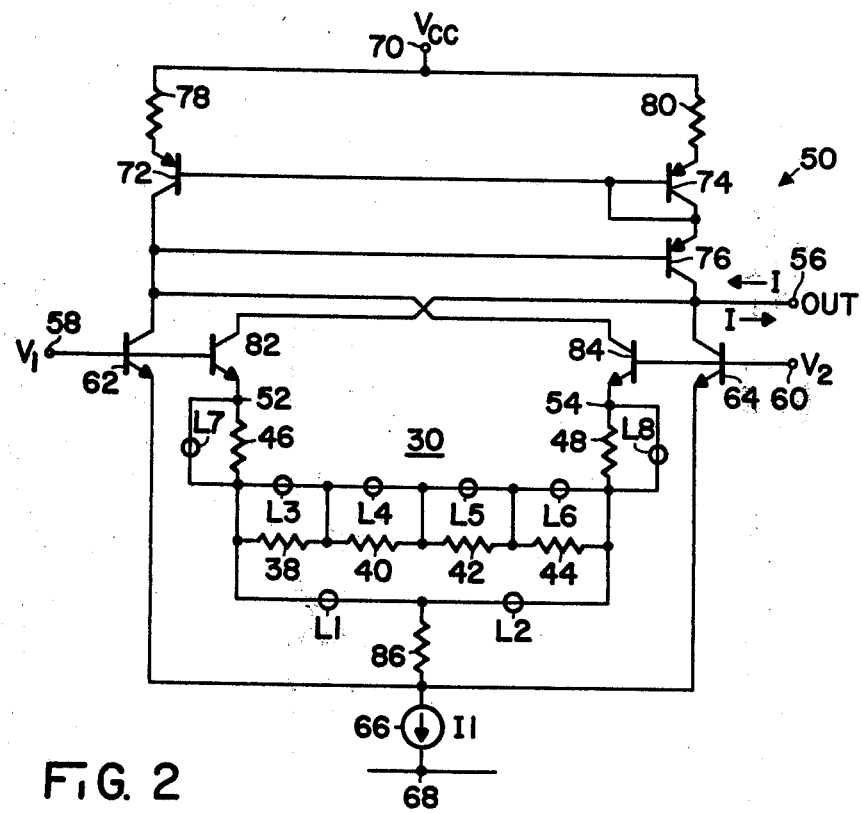
FIG. 2 illustrates in schematic form a current reciprocator circuit including the trim circuit of the present invention.

Referring now to FIG. 2 there is illustrated a current reciprocator circuit 50 comprising an active circuit portion having first and second internal nodes 52 and 54 and trim network 30 connected therebetween. Current reciprocator circuit 50 either sinks or sources the current I at output terminal 56 depending upon the polarity of the differential input voltage $\pm(V_1-V_2)$ applied at input terminals 58 and 60. Ideally it is desired that the magnitude of the current I remains constant even though its polarity is reversed. However, due again to processing tolerances, the value of I may vary between polarity states which is undesirous. Trim network 30 may be utilized to reduce or substantially eliminate errors in the value of output current I.

The active circuit portion of current reciprocator 50 includes differentially connected input transistors 62 and 64 each having respective base electrodes coupled to input terminals 58 and 60 of reciprocator circuit 50. The emitter electrodes of transistors 62 and 64 are connected to current source 66 which in turn is coupled to a reference potential at terminal 68. The collector electrodes of transistors 62 and 64 are coupled to power supply terminal 70 through a current mirror circuit comprising transistors 72, 74, 76 and resistors 78 and 80. Transistors 82 and 84 are provided to reduce error in output current I which would be caused by transient conditions if these transistors were otherwise not in the circuit. Transistors 82 and 84 are differentially coupled to resistor 86 through trim network 30. The base electrodes of transistors 82 and 84 are coupled to the base electrodes of transistors 62 and 64 respectively with the collector electrodes thereof being cross coupled to the collectors of transistors 62 and 64. Current through transistors 82 and 84 is supplied by current source 66, through resistor 86.

Without transistors 82, 84, trim network 30 and resistor 86 current reciprocator 50 suffers from several deleterious operating conditions as will be explained. Assuming that the aforementioned components are not part of reciprocator 50 the circuit would operate in the following manner. If the voltage $V_1$ is greater than $V_2$ transistor 62 will be conducting and transistor 64 will be in a non-conducting state. The value of the collector current flowing through transistor 72, produced by transistor 62 being rendered conductive, is mirrored by transistors 74 and 76, as understood, to produce a collector current through transistor 76 substantially equal in value to that of transistor 72. Hence, current is supplied or sourced out of terminal 56 which has a value substantially equal to $I_1$. In the next mode or state, with the voltage $V_2$ being greater than $V_1$, transistor 62 is caused to be non-conductive and transistor 64 conductive. In this mode the current mirror circuit is rendered non-conductive and transistor 64 sinks current from a load through terminal 56. Ideally, the current that is supplied by the load is equal to the current $I_1$. Thus, depending on the values of the input voltage, the reciprocator circuit would either source or sink current to or from a load which is coupled to terminal 56.

The above circuit suffers from two common problems: (1) poor matching of the magnitude of the two polarities of the output current, and (2) slow settling time in the output current after a change in the mode of operation of the circuit. Both of these problems arise because of the current mirror circuit. When $V_2$ becomes greater than $V_1$, transistors 72, 74 and 76 will continue to conduct until the base of transistor 76 rises to the voltage $V_{CC}$. Until these transistors are shut off there is an error in the output current. Thus, there is required some settling time until the value of current sourced into the reciprocator circuit equals the current supplied by the circuit after transition between operating modes. Mismatch between transistors 72 and 74 causes error between current into and out of the reciprocator circuit when the current mirror is active.

The addition of trim network 30 to reciprocator circuit 50 eliminates current mismatch problems, mentioned previously, at lower currents where matching is most important in many applications and which is typically the hardest to achieve. The addition of transistors 82 and 84 cause current to always be flowing in the current mirror circuit even during transistion so that settling time is reduced.

In the preferred embodiment resistor 86 is selected so that the current conducted through either transistor 82 or 84 (depending on the value of input voltage $V_1$ and $V_2$) is a predetermined fraction of $I_1$, e.g., one-tenth of the value of $I_1$. When transistors 62 and 82 are conducting, the current I flowing out of terminal 56 becomes less than $I_1$ by twice the value of the current flowing through transistor 82 which is stolen first from transistor 62 and then from transistor 76. When transistors 64 and 84 conduct the current flowing into terminal 56 is less than $I_1$ by twice the value of the current conducted through transistor 84. Therefore the magnitude of the output current I remains a constant value but is of opposite polarity depending upon the mode of operation of reciprocator circuit 50.

By cutting appropriate links, $L_1$-$L_8$, using the same method discussed supra, resistance can be added to resistor 86 in the current path of either transistor 82 or 84. If, for example, more resistance is added to the path through transistor 82 the current conducted therethrough will be less than before trim. In response, transistor 62 will conduct more current and current I will increase. This will compensate for mismatches in the current mirror circuit which caused transistor 76 to conduct less current than it should. Conversely, when resistance is added in the path of transistor 84 the magnitude of the current flowing into reciprocator circuit 50 is increased. Thus, trim network 30 provides a method whereby mismatches between transistors 72 and 74 can be compensated therefor.

What has been described above is a unique and novel laser trim network suitable to be utilized in monolithic integrated circuit applications to correct circuit operating errors caused by processing tolerances. In accordance with the invention there has been illustrated a differential amplifier and a novel reciprocator circuit employing the trim network.

What is claimed is:

1. An adjustable impedance network having trimable circuit means for adjusting the impedance value which appears between a first terminal and either a second or third terminal thereof, comprising:

a plurality of impedance elements being serially coupled together between the second and third terminals of the impedance network;

a plurality of alterable conductor means each coupled in parallel across a respective one of said plurality of impedance elements for electrically shorting said respective impedance element when in an unaltered condition; and first and second additional alterable conductor means serially coupled together in parallel across selected ones of said impedance elements for electrically shorting said selected ones of said impedance elements to the first terminal when in an unaltered condition, said plurality of impedance elements connected as aforesaid in combination with said plurality of alterable conductor means and said first and second additional conductor means causing the impedance value between the first terminal and either the second or third terminal to have a first predetermined value, said impedance value being caused to change in response to selectively altering selected ones of said plurality of alterable conductors means in conjunction with altering the appropriate one of said first and second additional alterable conductor means by causing the same to be open circuited.

2. The adjustable impedance network of claim 1 wherein:

said plurality of impedance elements being resistors; and said alterable conductor means being thermally machinable.

3. The adjustable impedance network of claim 1 wherein:

said trimable circuit means being formed in monolithic integrated circuit form having an electrically insulating substrate;

said plurality of impedance elements being formed on said substrate; and said alterable conductor means being formed on said substrate.

4. An integrated circuit including in combination an active circuit means having input terminals, at least one output terminal, first and second internal nodes, said active circuit means being responsive to applied input signals for generating desired output signals, an adjustable impedance network for eliminating voltage and current error signals associated with said active circuit means, said adjustable impedance network including a plurality of impedance elements serially coupled together between the first and second internal nodes of said active circuit means, a plurality of thermally machinable conductive means for electrically shorting respective ones of said plurality of impedance elements, first and second additional thermally machinable conductive means serially coupled together for electrically shorting a selective number of said plurality of impedance elements, said first and said second additional thermally machinable conductive means being commonly connected to a common node of said active circuit means, said selected ones of said plurality of thermally machinable conductive means being open circuited in conjunction with either one of said first and second additional thermally machinable conductive means being open circuited to cause the impedance value between said common node and the appropriate first or second internal node of said active circuit means to be varied accordingly.

5. The integrated circuit of claim 4 wherein said active circuit means includes a differential amplifier cirucit.

6. The integrated circuit of claim 4 wherein said active circuit means includes a current reciprocator circuit.

7. The integrated circuit of claim 6 wherein said current reciprocator circuit includes:

current mirror circuit means having a common terminal, first and second output terminals, said common terminal being coupled to a source of operating potential, said second output terminal being the output terminal of the active circuit means;

current source means;

a first pair of differentially connected transistor pairs, each transistor thereof having emitter, base and collector electrodes, said emitter electrodes of said transistor pairs being coupled to said current source means, said collector electrodes of said transistor pairs being coupled to a respective output terminal of said current mirror circuit means, said base electrodes being the input terminals of the active circuit means respectively;

resistive means having first and second terminals, said first terminal being coupled to said common node of the active circuit means, said second terminal being coupled to said current source means;

a second pair of differentially connected transistor pairs each having emitter, base and collector electrodes, said emitter electrodes being the first and second internal nodes of the active circuit means respectively, said base electrode of said first one of said second pair of transistors being coupled to said base electrode of said first one of said first pair of transistors, said base electrode of said second one of said second pair of transistors being coupled to said base electrode of said second one of said first pair of transistors, said collector electrodes of said second pair of transistors being cross-coupled respectively to said collector electrodes of said first pair of transistors; and said impedance value of the adjustable impedance network being caused to be adjusted between said common node and the selected one of said first and second internal nodes of the active circuit means such that errors in the output current appearing at the output terminal of the active circuit means are corrected.

8. An integrated differential amplifier circuit comprising:

current source means for providing a predetermined current;

first transistor means having first, second and control electrodes, said control electrode being a first input terminal of the differential amplifier circuit, said first electrode being coupled to said current source means, said second electrode being a first output terminal of the differential amplifier circuit;

second transistor means having first, second and control electrodes, said control electrode being a second input terminal of the differential amplifier circuit, said first electrode being coupled to said current source means, said second electrode being a second output terminal of the differential amplifier circuit; and an adjustable impedance network coupled between said first and second output terminals of the differential amplifier circuit and a source of operating potential for substantially eliminating input voltage offset errors in the differential amplifier circuit, said adjustable impedance network including a plurality of impedance elements serially coupled together between said first and second output terminals of the differential amplifier circuit, a plurality of thermally machinable metallic links each coupled in parallel across a respective one of said plurality of impedance elements for electrically shorting the same, first and second additional thermally machinable metallic links serially coupled together and being in parallel with a selected number of said plurality of impedance elements for electrically shorting thereof, said first and second additional metal links being commonly connected to said source of operating potential, said plurality of metallic links being selectively machined in conjunction with a predetermined one of said first and second additional metallic links such that the impedance value is increased between the respective transistor means and said source of operating potential to eliminate said input voltage offset error.

9. An integrated current reciprocator circuit for providing an output current at an output thereof the polarity of which being dependent upon the polarity of an input signal applied to input terminals of the current reciprocator circuit, comprising:

current source means;

current mirror circuit means for providing first and second output currents at first and second output terminals respectively, said second output terminal being the output terminal of the current reciprocator circuit;

a first differential transistor stage including first and second transistor means each having first, second and control electrodes, said control electrodes being input terminals of the current reciprocator circuit, said first electrodes of said first and second transistor means being coupled to said current source means, said second electrodes of said first and second transistor means being coupled respectively to said first and second output terminals of said current mirror circuit means;

a second differential transistor stage including third and fourth transistor means each having first, second and control electrodes, said control electrodes of said third and fourth transistor means being coupled respectively to said control electrodes of said first and second transistor means, said second electrodes of said third and fourth transistor means being cross coupled respectively to said second electrodes of said second and first transistor means;

an adjustable impedance network for causing the magnitude of the output current of the reciprocator current to be maintained substantially constant but opposite in polarity depending upon the polarity of the input signal, said adjustable impedance network including a plurality of impedance elements serially coupled together between said first electrodes of said third and fourth transistor means, a plurality of thermally machinable metal links each coupled in parallel across a respective one of said plurality of impedance elements for electrically shorting the same, first and second additional thermally machinable metal links serially coupled together and being in parallel with a selected number of said plurality of impedance elements for electrically shorting thereof, said first and second additional metal links being commonly connected to a common node, selected ones of said plurality of metal links being open circuited in conjunction with a predetermined one of said first and second additional metal links being open circuited to vary the magnitude of the output current accordingly; and circuit means coupling said common node of the adjustable impedance network to said current source means.

* * * * *